(12) United States Patent
Shi et al.

(10) Patent No.: US 11,430,657 B2
(45) Date of Patent: Aug. 30, 2022

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wei Shi, Shanghai (CN); Youcun Hu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 154 days.

(21) Appl. No.: 16/804,192

(22) Filed: Feb. 28, 2020

(65) Prior Publication Data

US 2020/0279741 A1    Sep. 3, 2020

(30) Foreign Application Priority Data

Mar. 1, 2019    (CN) .......................... 201910156244.1

(51) Int. Cl.
*H01L 21/033* (2006.01)
*H01L 21/3115* (2006.01)
*H01L 21/311* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31111* (2013.01); *H01L 21/31155* (2013.01)

(58) Field of Classification Search
CPC ............ H01L 21/0332; H01L 21/0335; H01L 21/0337; H01L 21/0338; H01L 21/31105–31122; H01L 21/31155; H01L 21/32; H01L 21/31144
See application file for complete search history.

(56) References Cited

U.S. PATENT DOCUMENTS

| | | | | |
|---|---|---|---|---|
| 10,714,343 | B1* | 7/2020 | Chen | H01L 21/31111 |
| 2008/0132073 | A1* | 6/2008 | Yoon | H01L 21/31111 |
| | | | | 257/E21.235 |
| 2014/0273461 | A1* | 9/2014 | Lee | H01L 21/31155 |
| | | | | 438/778 |

(Continued)

*Primary Examiner* — Scott B Geyer
(74) *Attorney, Agent, or Firm* — Anova Law Group, PLLC

(57) ABSTRACT

A method for fabricating a semiconductor device includes providing a to-be-etched layer, including alternately arranged first regions and second regions in a first direction. Each first region adjoins adjacent second regions, and each second region includes a trench region. The method includes forming a first mask layer on the to-be-etched layer; implanting doping ions into the first mask layer outside of the trench region; forming a doped separation layer in the first mask layer of the second region to divide the first mask layer into portions arranged in a second direction perpendicular to the first direction; forming a first trench in the first mask layer of the first region; and removing the first mask layer formed in the trench region on both sides of the doped separation layer to form a second trench divided into portions arranged in the second direction by the doped separation layer.

18 Claims, 13 Drawing Sheets

(56) References Cited

U.S. PATENT DOCUMENTS

| | | | |
|---|---|---|---|
| 2019/0027365 A1* | 1/2019 | Chou | H01L 21/31144 |
| 2020/0279738 A1* | 9/2020 | Shi | H01L 21/76802 |
| 2020/0279740 A1* | 9/2020 | Jin | H01L 21/47576 |

* cited by examiner

| Providing a to-be-etched layer, including a plurality of discrete first regions and a plurality of discrete second regions that are arranged alternately along a first direction, the plurality of second regions including a plurality of trench regions | S401 |

| Forming a first mask layer on the to-be-etched layer in both the plurality of first regions and the plurality of second regions | S402 |

| Implanting doping ions into the portion of the first mask layer formed outside of the plurality of trench regions | S403 |

| Forming a doped separation layer in the portion of the first mask layer of each second region, the doped separation layer dividing the first mask layer formed in the corresponding trench region into portions arranged in a second direction perpendicular to the first direction | S404 |

| Forming a top mask layer on the portion of the first mask layer that is formed in the first region, where the projection pattern of the top mask layer on the surface of the first mask layer divides the first mask layer formed in the first region into portions arranged in the second region, and the top mask layer and the doped separation layer are separated from each other along the second direction | S405 |

| Forming a first trench in the first mask layer of the first region by removing the portion of the first mask layer in the first region on both sides of the top mask layer using the top mask layer as an etch mask, where the portion of the first mask layer covered by the top mask layer in the first region forms a separation mask layer | S406 |

| Removing the top mask layer | S407 |

| Forming a sidewall spacing layer on the sidewall surfaces of each first trench | S408 |

| Forming a second trench in the first mask layer of the second region by removing the portion of the first mask layer in the trench region on both sides of the doped separation layer, the doped separation layer dividing the second trench into portions arranged in the second direction | S409 |

SEMICONDUCTOR DEVICES AND FABRICATION METHODS THEREOF

CROSS-REFERENCES TO RELATED APPLICATIONS

This application claims the priority of Chinese Patent Application No. CN201910156244.1, filed on Mar. 1, 2019, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

In the process of fabricating semiconductor devices, a photolithography process is usually adopted to transfer the pattern on a mask to a substrate. The photolithography process includes: providing a substrate; forming a photoresist layer on the substrate; exposing and developing the photoresist layer to form a patterned photoresist layer, such that the pattern on the mask is transferred to the photoresist layer; etching the substrate using the patterned photoresist layer as a mask, such that the pattern on the photoresist layer is transferred to the substrate; and removing the photoresist layer.

With the size of semiconductor device continuously becoming smaller, the critical photolithography dimension gradually approaches or even exceeds the physical limits of the photolithography process, which leads to more serious challenges to the photolithography technique. A dual reconstruction technique is adopted in order to overcome these challenges. The basic idea of the dual reconstruction technique is to form the final target pattern through a double-patterning process, such that the photolithography limits for a single-patterning process may be overcome. That is, a critical dimension that cannot be realized by a single-patterning process may be achieved through a double-patterning process.

However, the performance of semiconductor devices fabricated based on existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a to-be-etched layer, including a plurality of discrete first regions and a plurality of discrete second regions arranged alternately along a first direction. For a second region of the plurality of discrete second regions adjacent to a first region of the plurality of discrete first regions, the first region and the second region adjoin each other. Each second region of the plurality of discrete second regions includes a trench region. The method also includes forming a first mask layer on the to-be-etched layer in both the plurality of discrete first regions and the plurality of discrete second regions; implanting doping ions into the first mask layer formed outside of the trench region; and forming a doped separation layer in the first mask layer of each second region. The doped separation layer divides the first mask layer formed in the trench region into portions arranged in a second direction perpendicular to the first direction. The method further includes forming a first trench in the first mask layer of each first region of the plurality of discrete first regions; and removing the first mask layer formed in the trench region on both sides of the doped separation layer to form a second trench in the first mask layer of the second region. The doped separation layer divides the second trench into portions arranged in the second direction.

Another aspect of the present disclosure provides a semiconductor device. The semiconductor device includes a to-be-etched layer, including a plurality of discrete first regions and a plurality of discrete second regions arranged alternately along a first direction. For a first region of the plurality of discrete first regions adjacent to a second region of the plurality of discrete second regions, the first region and the second region adjoin each other. The semiconductor device also includes a first mask layer, formed on the to-be-etched layer and implanted with doping ions; a plurality of first trenches, formed in the first mask layer of the plurality of discrete first regions. Each first trench of the plurality of first trenches is divided into portions arranged in a second direction perpendicular to the first direction by a separation mask layer. The semiconductor device further includes a plurality of second trenches, formed in the first mask layer of the plurality of discrete second regions. Each second trench of the plurality of second trenches is divided into portions arranged in the second direction by a doped separation layer. The semiconductor device also includes a sidewall spacing layer serving as sidewalls of each first trench of the plurality of first trenches.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 24 illustrates a flowchart of an exemplary method for fabricating a semiconductor device consistent with various embodiments of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In current technology, the performance of semiconductor devices may still need to be improved. FIGS. 1-6 illustrate schematic views of semiconductor structures at certain stages of a fabrication process of a semiconductor device.

Figure 1:
FIGS. 1-6 illustrate schematic views of semiconductor structures at certain stages of a fabrication process of a semiconductor device.

Referring to FIG. 1, a to-be-etched layer 100 is provided. The to-be-etched layer 100 includes a plurality of discrete first regions A01 and a plurality of discrete second regions A02. The plurality of first regions A01 and the plurality of second regions A02 are arranged alternately along a first direction X. For a first region A01 adjacent to a second region A02, the first region A01 and the second region A02 adjoin each other or in contact with each other. Each second region A02 includes a trench region.

Figure 2:
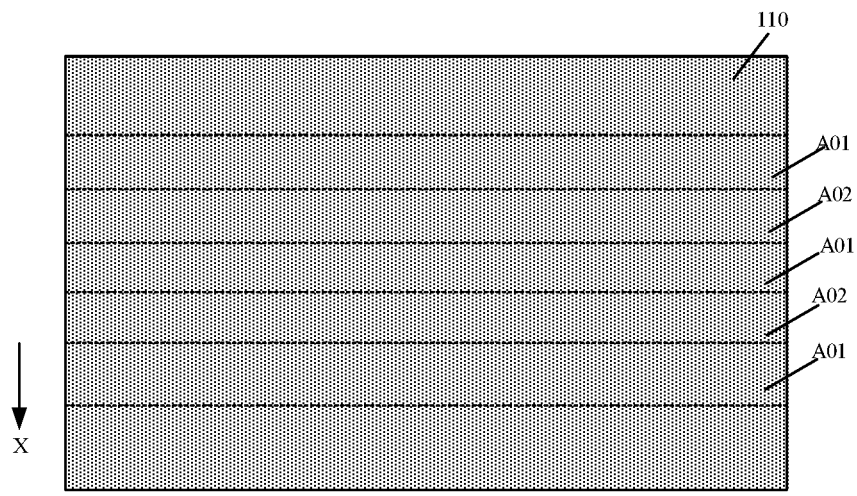

Referring to FIG. 2, a first mask layer 110 is formed on the plurality of first regions A01 and the plurality of second regions A02 of the to-be-etched layer 100.

Figure 3:
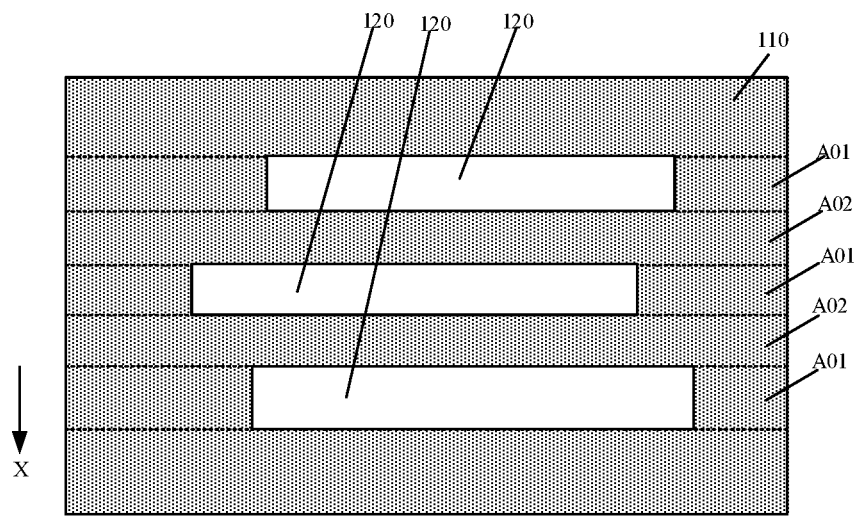

Referring to FIG. 3, doping ions are implanted into the first mask layer 110 that is formed outside of the plurality of trench regions, and a plurality of discrete first trenches 120 is formed in the first mask layer 110 of the plurality of first regions A01.

Figure 4:
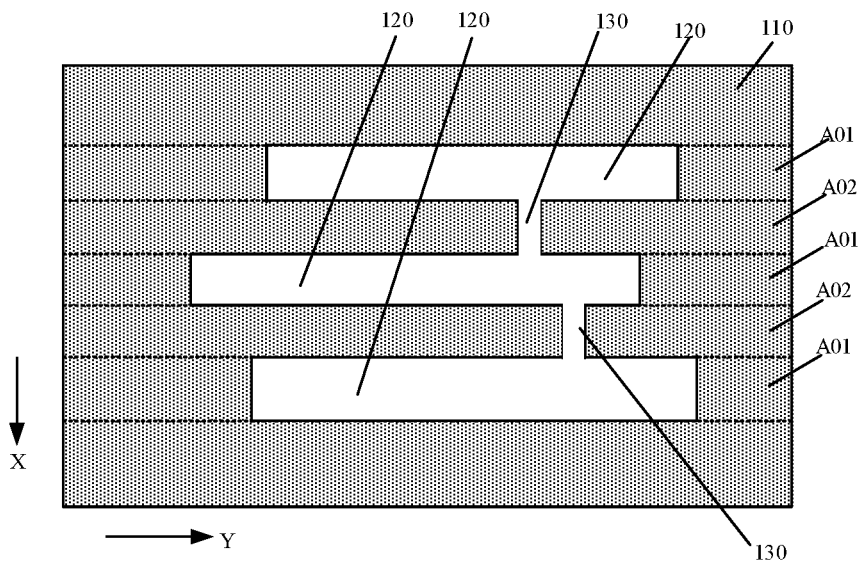

Referring to FIG. 4, after forming the plurality of first trenches 120, a plurality of discrete separation trenches 130 is formed in the first mask layer 110 of the plurality of second regions A02. The separation trench 130 divides the first mask layer 110 of the corresponding trench region A02 into portions arranged in a second direction Y. The second direction Y is perpendicular to the first direction X.

Figure 5:
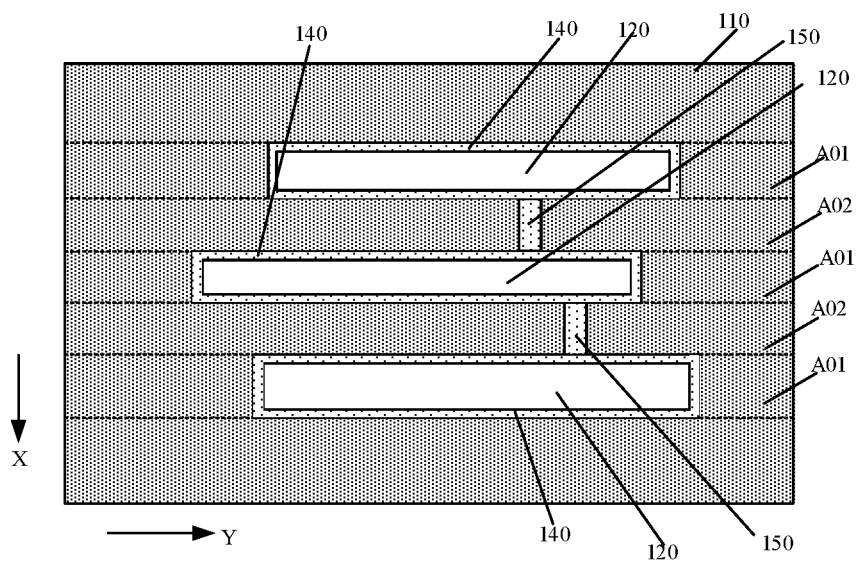

Referring to FIG. 5, after forming the plurality of separation trenches 130, a sidewall spacing layer 140 is formed on the sidewall surfaces of each first trench 120. During the formation of the sidewall spacing layer 140, a separation layer 150 is formed in each separation trench 130.

Figure 6:
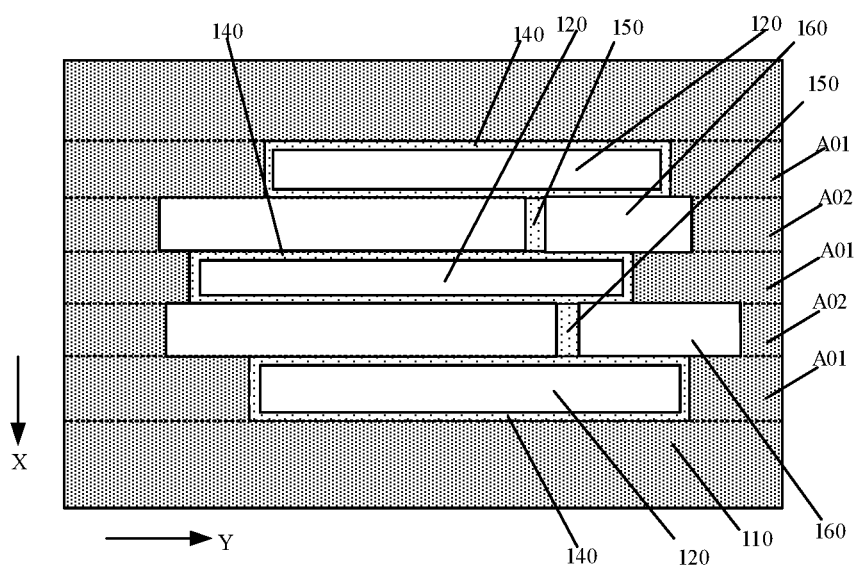

Referring to FIG. 6, after forming the sidewall spacing layer 140 and the separation layer 150, the portion of the first mask layer 110 formed in the trench region on both sides of each separation layer 150 is removed to form a second trench 160. The second trench 160 is located on both sides of the separation layer 150 in the second direction Y.

According to the fabrication process described above, because the separation trench 130 is formed after forming the first trench 120, the photolithography material (e.g., photoresist) used for forming the separation trench 130 needs to be filled into the first trench 120, which leads to an adverse exposing process for the photolithography material in defining the position of the separation trench 130. Alternatively, when the process of forming the separation trench 130 is performed prior to forming the first trench 120, the photolithography material that is used to define the position of the first trench 120 needs to be filled into the separation trench 130, which leads to an adverse exposing process for the photolithography material in defining the position of the first trench 120. Therefore, the performance of the semiconductor device fabricated through either process described above may be undesired.

The present disclosure provides a method for forming semiconductor devices. The method includes providing a substrate including a plurality of first regions and a plurality of second regions that are arranged alternately along a first direction with the plurality of second regions including a plurality of trench regions; forming a first mask layer on the substrate; implanting doping ions into the first mask layer formed outside of the plurality of trench regions; forming a plurality of discrete doped separation layers in the first mask layer of the plurality of second regions with each doped separation layer dividing the first mask layer of a corresponding trench region into portions arranged in a second direction perpendicular to the first direction; after implanting the doping ions into the first mask layer formed outside of the plurality of trench regions and forming the plurality of doped separation layers, forming a plurality of first trenches in the first mask layer of the plurality of first regions; after forming the plurality of first trenches, removing the portion of the first mask layer formed in the trench region on both sides of each doped separation layer to form a second trench in the first mask layer of a corresponding second region, the doped separation layer dividing the second trench into portions arranged in the second direction. According to the disclosed method, the performance of the fabricated semiconductor device may be improved.

FIG. 24 illustrates a flowchart of an exemplary method for fabricating a semiconductor device consistent with various embodiments of the present disclosure. FIGS. 7-23 illustrate schematic views of semiconductor structures at certain stages of the exemplary method.

Figure 7:
FIGS. 7-23 illustrate schematic views of semiconductor structures at certain stages of an exemplary method for fabricating a semiconductor device consistent with some embodiments of the present disclosure.

Referring to FIG. 24, at the beginning of the fabrication process, a to-be-etched layer may be provided, the to-be-etched layer may include a plurality of discrete first regions and a plurality of discrete second regions that are arranged alternately along a first direction, and the plurality of second regions may include a plurality of trench regions (S401). FIG. 7 illustrates a schematic top view of a semiconductor structure consistent with various embodiments of the present disclosure.

Referring to FIG. 7, a to-be-etched layer 200 may be provided. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other or in contact with each other.

In one embodiment, the plurality of first regions A1 may be arranged along the first direction X, and the plurality of second regions A2 may also be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2.

Further, the plurality of second regions A2 includes a plurality of trench regions. That is, in the plurality of second regions A2, the to-be-etched layer 200 includes a plurality of trench regions. The plurality of trench regions may be used to define the position of a plurality of second trenches that may be formed in a subsequent process. Each trench region may adjoin the adjacent first regions, e.g., a trench region may share an edge with each first region A1 adjacent to the trench region. In addition, the trench region may be located on a side of the adjacent first region A1 along the first direction X, e.g. the edge shared by the trench region and the first region A1 may be perpendicular to the first direction X.

In some embodiments, the total number of the first regions may equal to the total number of the second regions.

In one embodiment, the to-be-etched layer 200 may be made of a material including silicon oxide or a low-k dielectric material (e.g., a material with a relative dielectric constant k smaller than or equal to 3.9).

Figure 8:
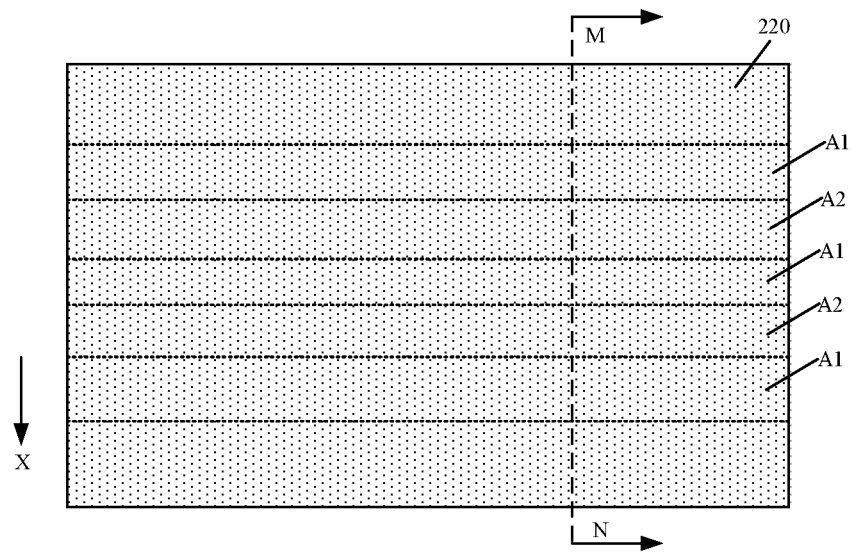
Figure 9:
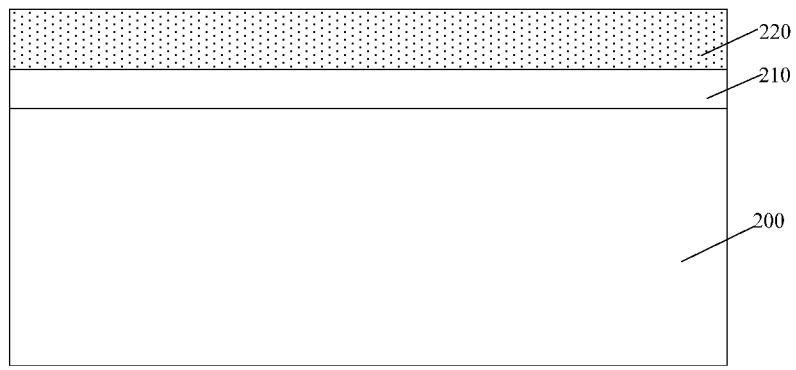

Further, returning to FIG. 24, a first mask layer may be formed on the to-be-etched layer in both the plurality of first regions and the plurality of second regions (S402). FIGS. 8-9 illustrate schematic views of a semiconductor structure consistent with various embodiments of the present disclosure. Specifically, FIG. 8 shows the semiconductor structure from a view direction consistent with that in FIG. 7, that is, FIG. 8 illustrates a schematic top view of the semiconductor structure; and FIG. 9 illustrates a schematic cross-sectional view of the semiconductor structure shown in FIG. 8 in an M-N direction.

Referring to FIGS. 8-9, a first mask layer 220 may be formed on the to-be-etched layer 200 in both the plurality of first regions A1 and the plurality of second regions A2. In one embodiment, the first mask layer 220 may be made of a material including amorphous silicon.

In some embodiments, prior to forming the first mask layer 220, the method may further include forming a first adhesion layer (not shown) on the to-be-etched layer 200; forming a bottom hard mask layer 210 on the first adhesion layer; and forming a second adhesion layer (not shown) on the bottom hard mask layer 210. Therefore, the first mask layer 220 may be formed on the second adhesion layer. In one embodiment, the bottom hard mask layer 210 may be made of a material including titanium nitride.

The material used for forming the first adhesion layer may include SiOC, and the material used for forming the second adhesion layer may include SiOC.

In one embodiment, the first adhesion layer may be used to improve the adhesion between the bottom hard mask layer 210 and the to-be-etched layer 200, such that the bonding between the bottom hard mask layer 210 and the to-be-etched layer 200 may be stronger. The second adhesion layer may be used to improve the adhesion between the first mask layer 220 and the bottom hard mask layer 210, such that the bonding between the first mask layer 220 and the bottom hard mask layer 210 may be stronger.

Further, the function of the bottom hard mask layer 210 may also include the following aspects. The bottom hard mask layer 210 may be used as an etch stop layer, e.g., the bottom hard mask layer 210 may be used as a stop layer during a subsequently performed planarization process on a conductive film. The bottom hard mask layer 210 may be made of a hard mask material, such that during subsequent formation of a plurality of first target trenches and a plurality of second target trenches, the etching loss of the bottom hard mask layer 210 may be limited. Therefore, during the process of transferring the pattern in the bottom hard mask layer 210 to the to-be-etched layer 200, the pattern transfer may demonstrate high stability.

In one embodiment, the bottom hard mask layer 210 and the first mask layer 220 may be made of different materials. In other embodiments, the fabrication method may not include forming the bottom hard mask layer, the first adhesion layer, and the second adhesion layer.

According to the present disclosure, the fabrication method may further include implanting doping ions into the first mask layer in a region outside of the plurality of trench regions. As such, a plurality of doped separation layers may be formed in the plurality of second regions A2 of the first mask layer 220. Each doped separation layer may divide the first mask layer of a corresponding trench region into portions arranged in a second direction (not labeled), and the second direction may be perpendicular to the first direction X.

In one embodiment, doping ions may be implanted into the first mask layer 220 outside of the plurality of trench regions, and then the plurality of doped separation layers may then be formed in the first mask layer 220 of the plurality of second regions. In other embodiments, the plurality of doped separation layers may be formed in the first mask layer of the plurality of second regions, and then doping ions may then be implanted into the first mask layer outside of the plurality of trench regions.

Figure 10:
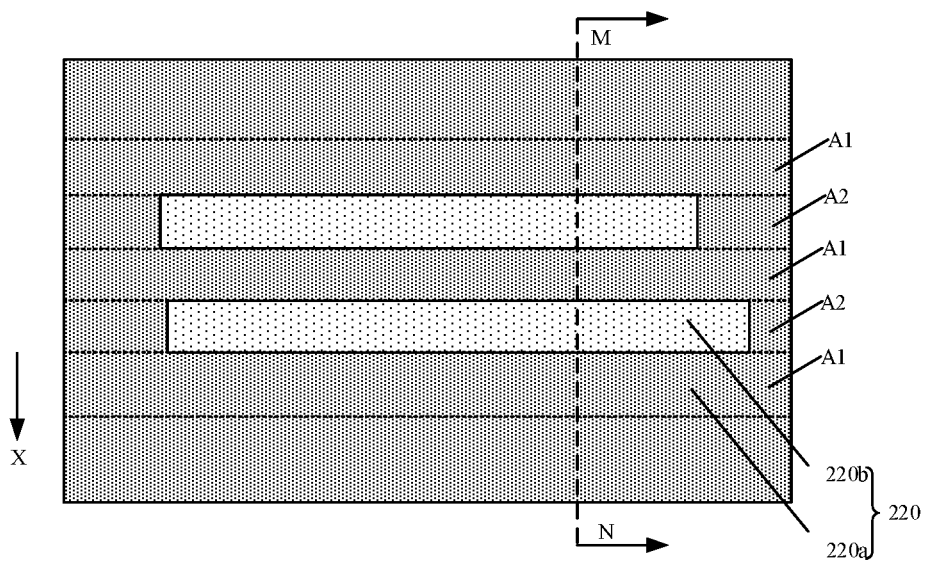
Figure 11:
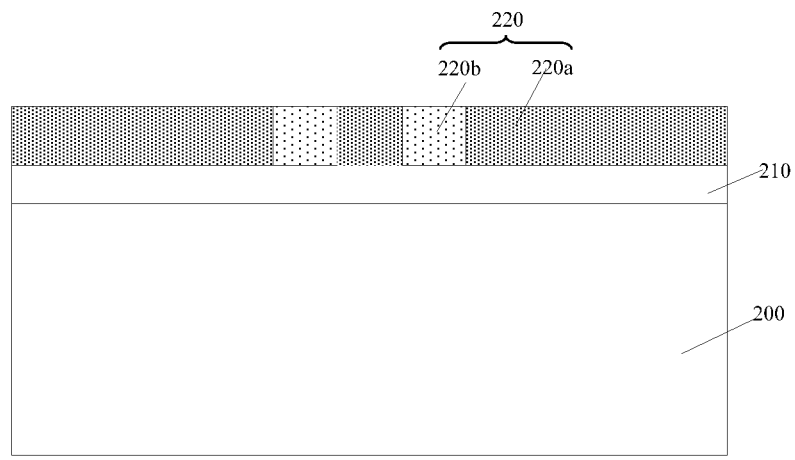

For example, returning to FIG. 24, doping ions may be implanted into the portion of the first mask layer formed outside of the plurality of trench regions (S403). FIGS. 10-11 illustrate schematic views of a semiconductor structure consistent with various embodiments of the present disclosure. Specifically, FIG. 10 shows the semiconductor structure from a view direction consistent with that in FIG. 8, and FIG. 11 shows the semiconductor structure from a view direction consistent with that in FIG. 9. That is, FIG. 11 illustrates a schematic cross-sectional view of the semiconductor structure shown in FIG. 10 in an M-N direction.

Referring to FIGS. 10-11, doping ions may be implanted into the portion of the first mask layer 220 formed outside of the plurality of trench regions. For example, the doping ions may be implanted into the portion of the first mask layer 220 formed in the first regions A1, and also into the portion of the first mask layer 220 formed in the second regions A2 outside of the trench regions.

In one embodiment, the process of implanting doping ions into the portion of the first mask layer 220 formed outside of the plurality of trench regions may include the following exemplary steps. A first planarization layer may be formed on the first mask layer 220, a first bottom anti-reflective layer may be formed on the first planarization layer, and a first photoresist layer (not shown) may be formed and patterned on the first bottom anti-reflective layer. The first photoresist layer may cover the portion of the first bottom anti-reflective layer that is formed in the plurality of trench regions. The first photoresist layer may expose the portion of the first bottom anti-reflective layer formed in the plurality of first regions A1 and may also expose the portion of the first bottom anti-reflective layer formed in the plurality of second regions A2 and surrounding the plurality of trench regions. The first bottom anti-reflective layer and the first planarization layer may be etched using the first photoresist layer as an etch mask until the top surface of the first mask layer 220 is exposed. After etching the first bottom anti-reflective layer and the first planarization layer using the first photoresist layer as the etch mask to expose the top surface of the first mask layer 220, doping ions may be implanted into the portion of the first mask layer 220 that is formed outside of the plurality of trench regions using the first photoresist layer as a mask. After implanting doping ions into the portion of the first mask layer 220 that is formed outside of the plurality of trench regions using the first photoresist layer as the mask, the first planarization layer, the first bottom anti-reflective layer, and the first photoresist layer may be removed.

In one embodiment, after implanting doping ions into the portion of the first mask layer 220 formed outside of the plurality of trench regions, the first mask layer 220 may be divided into an ion-doped region 220a and an undoped region 220b.

In one embodiment, the first photoresist layer may expose the portion of the first mask layer 220 formed in the plurality of first regions A1. In other embodiments, the first photoresist layer may partially cover the portion of the first mask layer formed in the plurality of first regions.

In one embodiment, the doping ions may include boron ions and/or arsenic ions.

When implanting the doping ions into the portion of the first mask layer 220 that is formed outside of the plurality of trench regions, due to the blocking of the first mask layer 220 and also because a plurality of first trenches and a plurality of second trenches have not been formed in the first mask layer 220 yet, the doping ions may be well prevented from being implanted into the material layer at the bottom of the first mask layer 220.

In one embodiment, when implanting the doping ions into the portion of the first mask layer 220 formed outside of the plurality of trench regions, the surface of the first mask layer 220 may be flat, and thus the first planarization layer, the first bottom anti-reflective layer, and the first photoresist layer may all formed on the desired flat surface of the first mask layer 220, which may be conducive to the exposure process for patterning the first photoresist layer.

Figure 12:
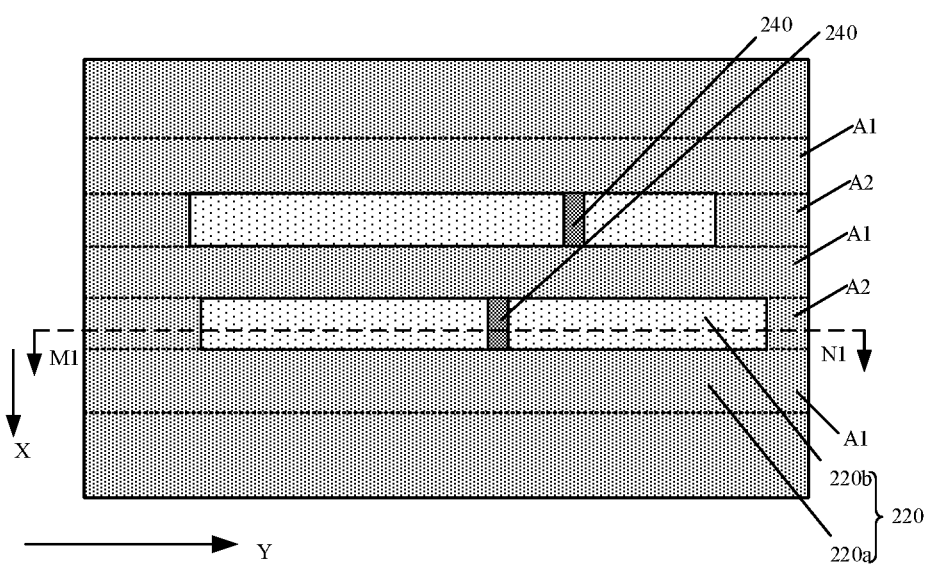
Figure 13:
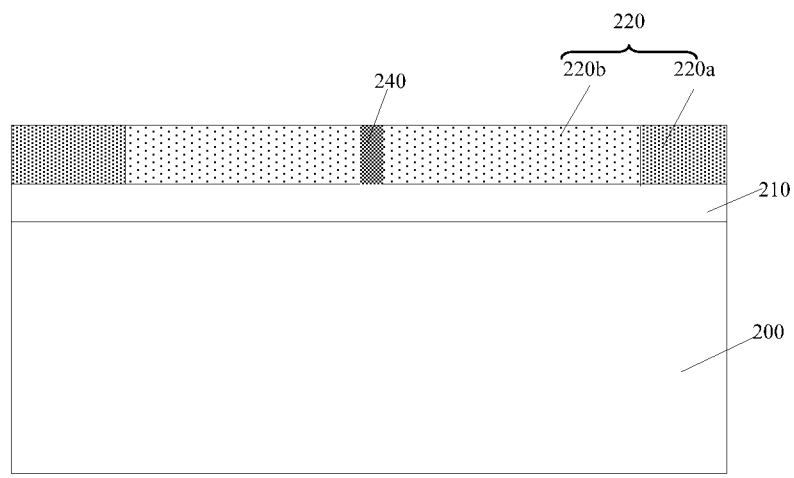

Further, returning to FIG. 24, a doped separation layer may be formed in the portion of the first mask layer of the second region, and the doped separation layer may divide the first mask layer of the trench region into portions arranged in a second direction perpendicular to the first direction (S404). FIGS. 12-13 illustrate schematic views of a semiconductor structure consistent with various embodiments of the present disclosure. Specifically, FIG. 12 shows the semiconductor structure from a view direction consistent with that in FIG. 10, and FIG. 13 illustrates a schematic cross-sectional view of the semiconductor structure shown in FIG. 12 in an M1-N1 direction.

Referring to FIGS. 12-13, a doped separation layer 240 may be formed in the portion of the first mask layer 220 of the second region A2, and the doped separation layer 240 may divide the first mask layer 220 of the trench region into portions arranged in a second direction Y. The second direction Y may be perpendicular to the first direction X.

In one embodiment, an ion implantation process may be adopted to implant the doping ions into the portion of the first mask layer 220 in the second region A2 to form the doped separation layer 240.

In one embodiment, when forming the doped separation layer 240, the doping ions may also be implanted into a portion of the first mask layer 220 that is located in the first region A1 adjacent to the doped separation layer 240 along the first direction X.

For example, the process of forming the doped separation layer 240 may include the following exemplary steps. A second planarization layer may be formed on the first mask layer 220, a second bottom anti-reflective layer may be formed on the second planarization layer, and a second photoresist layer may be formed and patterned on the second bottom anti-reflective layer. A plurality of second lithography openings may be formed in the second photoresist layer. Each second lithography opening may be located on a portion of the trench region, and may also extend to the adjacent first region A1 along the first direction X. The second bottom anti-reflective layer and the second planarization layer at the bottom of each second lithography opening may be etched using the second photoresist layer as an etch mask until the top surface of the first mask layer 220 is exposed. After etching the second bottom anti-reflective layer and the second planarization layer at the bottom of the second lithography opening using the second photoresist layer as the etch mask, doping ions may be implanted into the portion of the first mask layer 220 located at the bottom of the second lithography opening using the second photoresist layer as a mask. Further, the second planarization layer, the second bottom anti-reflective layer, and the second photoresist layer may be removed.

The length direction (e.g., the extending direction) of the second lithography opening may be parallel to the first direction X. In one embodiment, the width of the second lithography opening in the second direction Y may be used to define the size of the doped separation layer 240 in the second direction Y. Because the size of the doped separation layer 240 in the second direction Y is required to be small, the width of the second lithography opening in the second direction Y may be small. For example, in one embodiment, the width of the second lithography opening in the second direction Y may be in a range of approximately 20 nm to 60 nm, e.g. 20 nm, 30 nm, 40 nm, 50 nm, 60 nm, etc.

In one embodiment, because the second lithography opening may also extend to the adjacent first region A1, the size of the second lithography opening in the first direction X may be allowed to be made large, such that the size of the second lithography opening may only need to be limited in the second direction Y, while the size of the second lithography opening in the first direction X may not need to be defined small. As such, the challenge on the photolithography process may be lowered, and the process difficulty may be reduced. In one embodiment, the size of the second lithography opening in the first direction X may be in a range of approximately 65 nm to 1000 nm, e.g. 80 nm, 100 nm, 200 nm, etc.

In one embodiment, the size of the doped separation layer 240 in the first direction X may be in a range of approximately 10 nm to 60 nm, and the size of the doped separation layer 240 in the second direction Y may be in a range of approximately 10 nm to 40 nm.

In one embodiment, during the process of implanting the doping ions into the portion of the first mask layer 220 formed outside of the plurality of trench regions, the doping ions may also be implanted into the portion of the first mask layer 220 formed in the plurality of first regions A1. Moreover, during the process of forming the doped separation layer 240, the doping ions may also be implanted into a portion of the first mask layer 220 that is located in the first region A1 adjacent to the doped separation layer 240 along the first direction X. As such, the definition of the ion-doped region and the undoped region in the first mask layer 220 may not be affected. Because the doping ions are implanted into a portion of the first mask layer 220 that is located in the first region adjacent to the doped separation layer 240 along the first direction X during the process of forming the doped separation layer 240, the process difficulty for forming the doped separation layer 240 may be reduced.

During the process of forming the doped separation layer 240, due to the blocking of the first mask layer 220 and also because the process for forming a plurality of first trenches and a plurality of second trenches in the first mask layer 220 has not been performed, the doping ions may be prevented from being implanted into the material layer at the bottom of the first mask layer 220.

In one embodiment, during the process of forming the doped separation layer 240, the surface of the first mask layer 220 may be flat, and thus the second planarization layer, the second bottom anti-reflective layer, and the second photoresist layer may all formed on the desired flat surface of the first mask layer 220, which may be conducive to the exposure process for patterning the second photoresist layer.

Figure 14:
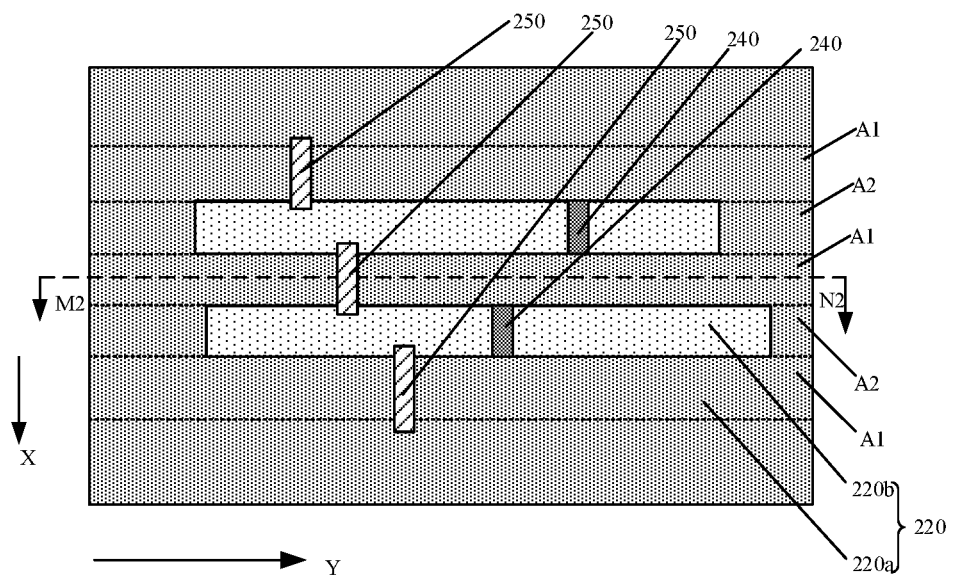
Figure 15:
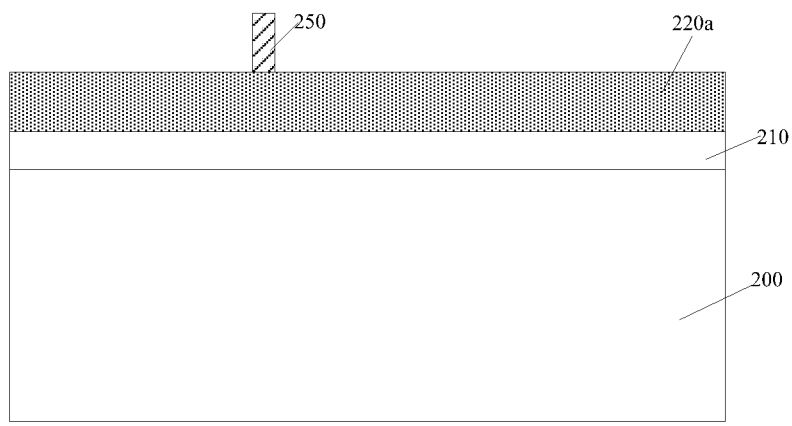

Further, returning to FIG. 24, after implanting the doping ions into the portion of the first mask layer formed outside of the plurality of trench regions and forming the doped separation layer, a top mask layer may be formed on a portion of the first mask layer that is formed in the first regions, the projection pattern of the top mask layer on the surface of the first mask layer may divide the first mask layer of the first region into portions arranged in the second direction, and the top mask layer and the doped separation layer may be separated from each other in the second direction (S405). FIGS. 14-15 illustrate schematic views of a semiconductor structure consistent with various embodiments of the present disclosure. Specifically, FIG. 14 shows the semiconductor structure from a view direction consistent with that in FIG. 12, and FIG. 15 illustrates a schematic cross-sectional view of the semiconductor structure shown in FIG. 14 in an M2-N2 direction.

Referring to FIGS. 14-15, a top mask layer 250 may be formed on a portion of the first mask layer 220 that is formed in the plurality of first regions A1. The projection pattern of the top mask layer 250 on the surface of the first mask layer 220 may divide the first mask layer 220 of the first region A1 into portions arranged in the second direction Y. The distance from the top mask layer 250 to the doped separation layer 240 in the second direction Y may be larger than zero. That is, along the second direction Y, the top mask layer 250 and the doped separation layer 240 may be spaced from each other.

For a first region and a second region that are adjacent to each other, along the second direction Y, the distance from the top mask layer 250 formed in the first region A1 to the doped separation layer 240 formed in the second region A2 may be larger than zero. That is, for a first region and a second region that are adjacent to each other, the position of the top mask layer 250 formed in the first region A1 and the position of the doped separation layer 240 formed in the second region A2 may be spaced from each other along the second direction Y.

In one embodiment, the top mask layer 250 may be made of a material including $SiO_2$, SiN, $TiO_2$, TiN, AlN, $Al_2O_3$, etc. In addition, the material of the top mask layer 250 may be different from the material of the first mask layer 220.

In one embodiment, the width of the top mask layer 250 in the second direction Y may be in a range of approximately 10 nm to 40 nm.

In one embodiment, the top mask layer 250 may also extend along the first direction X to cover a portion of the first mask layer 220 formed in the second region A2, such that the size of the top mask layer 250 in the first direction X may be large. Because the size of the top mask layer 250 may only need to be limited in the second direction Y, the process difficulty for forming the top mask layer 250 may be reduced. In one embodiment, the extending direction (e.g. the length direction) of the top mask layer 250 may be parallel to the first direction X.

In other embodiments, the top mask layer may not be able to extend in the first direction to cover a portion of the first mask layer formed in the second region.

In one embodiment, the process of forming the top mask layer 250 may include the following exemplary steps. A block layer (not shown) may be formed on the first mask layer 220 and the doped separation layer 240. A block-layer opening may be formed in the block layer, and the block-layer opening may be located on a portion of the first mask layer 220 formed in the first region A1, and may also extend along the first direction to expose a portion of the first mask layer 220 formed in the adjacent second regions A2. The block-layer opening formed in each first region A1 may divide the first mask layer 220 formed in the first region A1 into portions arranged in the second direction Y. The top mask layer 250 may then be formed in the block-layer opening. After forming the top mask layer 250 in the block-layer opening, the block layer may be removed.

In one embodiment, the extending direction (e.g., the length direction) of the block-layer opening may be parallel to the first direction X, and the block-layer opening may define the position of the top mask layer 250. The block layer may be made of a material including a carbon-containing organic polymer.

In one embodiment, the process of forming the block layer may include the following exemplary steps. A third planarization layer may be formed on the first mask layer 220 and the doped separation layer 240, a third bottom anti-reflective layer may be formed on the third planarization layer, and a third photoresist layer may be formed and patterned on the third bottom anti-reflective layer. A plurality of third lithography openings may be formed in the third photoresist layer. The third lithography opening may define the position of the block-layer opening. The third bottom anti-reflective layer and the third planarization layer at the bottom of each third lithography opening may be etched using the third photoresist layer as an etch mask until the top surface of the first mask layer 220 is exposed. As such, the remaining portion of the third planarization layer may form the block layer. Further, the third bottom anti-reflective layer and the third photoresist layer may be removed.

In one embodiment, the width of the block-layer opening in the second direction Y may be used to define the size of the top mask layer 250 in the second direction Y. Because the size of the top mask layer 250 in the second direction Y may need to be small, the width of the block-layer opening may also need to be small. For example, in one embodiment, the width of the block-layer opening in the second direction Y may be in a range of approximately 10 nm to 40 nm, e.g., 20 nm, 30 nm, 40 nm, etc.

Because the block-layer opening also extends to the second region A2 along the first direction X, the size of the block-layer opening in the first direction X may be large. Therefore, the size of the block-layer opening may only need to be limited in the second direction Y, while the size of the block-layer opening in the first direction X may not need to be defined small.

Because the third lithography opening defines the position of the block-layer opening, the size of each third lithography opening in the first direction X may correspond to the size of the block-layer opening in the first direction X, and the size of each third lithography opening in the second direction Y may correspond to the size of the block-layer opening in the second direction Y. Therefore, the size of the third lithography opening may only need to be limited in the second direction Y, while the size of the third lithography opening in the first direction X may not need to be defined small. As such, the challenge on the photolithography process may be lowered, and the process difficulty may be reduced.

In one embodiment, the size of the third lithography opening in the second direction Y may be in a range of approximately 10 nm to 40 nm, and the size of the third lithography opening in the first direction X may be in a range of approximately 65 nm to 1000 nm, e.g. 80 nm, 100 nm, 200 nm, etc.

Figure 16:
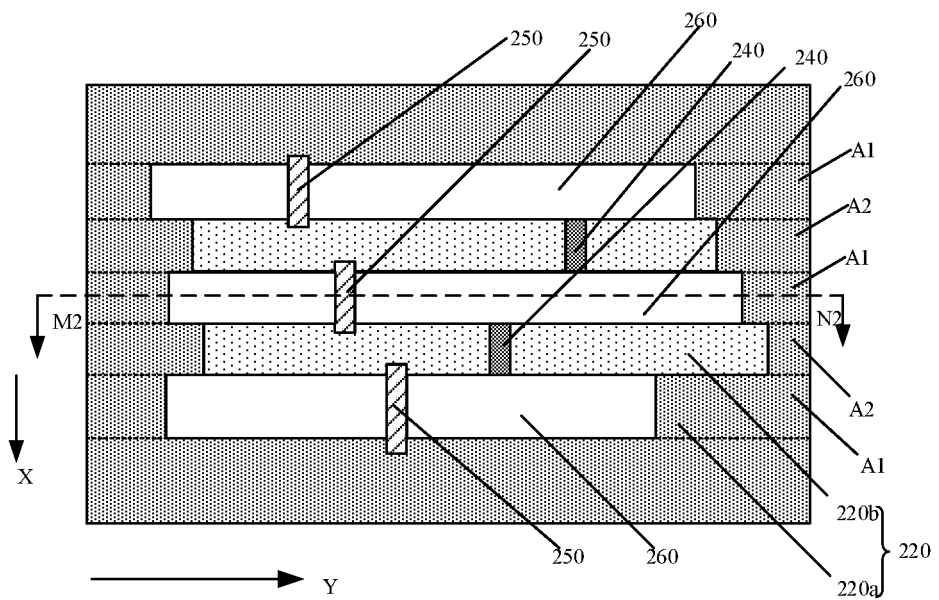
Figure 17:
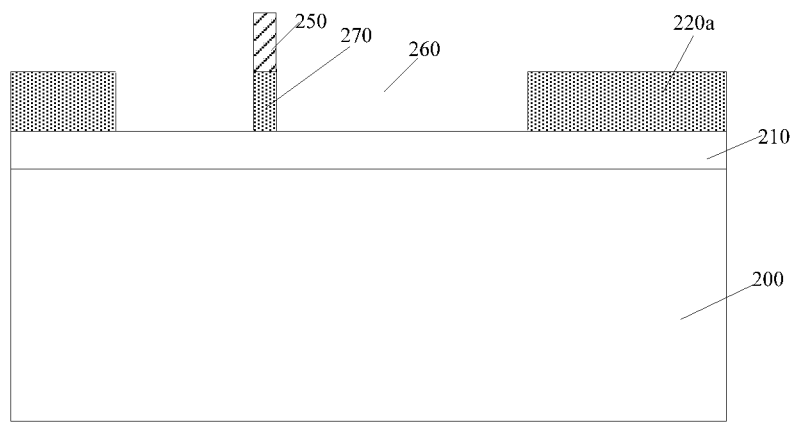

Further, returning to FIG. 24, a plurality of first trenches may be formed in the first mask layer of the first regions by removing the portion of the first mask layer in the first region on both sides of the top mask layer using the top mask layer as an etch mask, and during the formation of the first trenches, the portion of the first mask layer covered by the top mask layer in the first region may form a separation mask layer, which divides the first trench into portions arranged in the second direction (S406). FIGS. 16-17 illustrate schematic views of a semiconductor structure consistent with various embodiments of the present disclosure. Specifically, FIG. 16 shows the semiconductor structure from a view direction consistent with that in FIG. 14, and FIG. 17 illustrates a schematic cross-sectional view of the semiconductor structure shown in FIG. 16 in an M2-N2 direction.

Referring to FIGS. 16-17, the portion of the first mask layer 220 in the first region A1 located on both sides of the top mask layer 250 may be partially removed through an etching process using the top mask layer 250 as an etch mask to form a first trench 260 in the first mask layer 220 of the first region A1. During the formation of the first trench 260, the portion of the first mask layer 220 covered by the top mask layer 250 in the first region A1 may form a separation mask layer 270. The separation mask layer 270 may divide a corresponding first trench 260 into portions arranged in the second direction Y.

In one embodiment, when performing the etching process to form the plurality of first trenches 260, the portion of the first mask layer 220 located under the top mask layer 250 may become a plurality of discrete separation mask layers 270. Therefore, the plurality of separation mask layers 270 may be located under the top mask layer 250.

In one embodiment, the process of forming the plurality of first trenches 260 may include a dry etching process, for example, an anisotropic dry etching process, etc.

In one embodiment, the extending direction (e.g., the length direction) of each first trench 260 may be parallel to the second direction Y, and the second direction Y may be perpendicular to the first direction X.

In one embodiment, the width of the first trench 260 in the first direction X may be in a range of approximately 10 nm to 60 nm. Further, along the first direction X, the distance between two adjacent first trenches 260 may be in a range of approximately 10 nm to 60 nm.

It should be noted that in one embodiment, the plurality of first trenches 260 is formed in the first mask layer 220 of the first regions A1 after implanting the doping ions into the portion of the first mask layer 220 formed outside of the plurality of trench regions and forming the doped separation layer 240. Therefore, during the dry etching process for forming the plurality of first trenches 260, the etching rate of the portion of the first mask layer 220 that is implanted with the doping ions may need to be similar to the etching rate of the portion of the first mask layer 220 that is not implanted with the doping ions. That is, the doping ions implanted into the first mask layer 220 may have a small or negligible effect on the performance of dry etching the first mask layer 220. As such, the difficulty of the etching process for forming the plurality of first trenches may be reduced.

Because the size of the separation mask layer 270 in the first direction X is defined by the width of the first trench 260 in the first direction X, and the width of the first trench 260 in the first direction X is formed small, the size of the separation mask layer 270 in the first direction X may also be small. In addition, because the size of the separation mask layer 270 in the second direction Y is defined by the size of the top mask layer 250 in the second direction Y, and the size of the top mask layer 250 in the second direction Y is formed small, the size of the separation mask layer 270 in the second direction Y may also be small. Therefore, the size of the separation mask layer 270 may be small in both the first direction X and the second direction Y.

In one embodiment, the size of the separation mask layer 270 in the first direction X may be in a range of approximately 10 nm to 60 nm, and the size of the separation mask layer 270 in the second direction Y may be in a range of approximately 10 nm to 40 nm.

In one embodiment, the top mask layer 250 may be used as a mask when forming the plurality of first trenches 260. Therefore, when etching the first mask layer 220 of the first regions A1 to form the first trenches 260, the portion of the first mask layer 220 in the first regions A1 and located under the top mask layer 250 may be retained to form a plurality of discrete separation mask layers 270, and each first trench 260 may be divided into portions arranged in the second direction Y by a corresponding separation mask layer 270. Because the separation mask layer 270 is formed by a portion of the first mask layer 220, the bonding strength between the separation mask layer 270 and the bottom material may be strong, and thus the separation mask layer 270 may not easily collapse.

Figure 18:
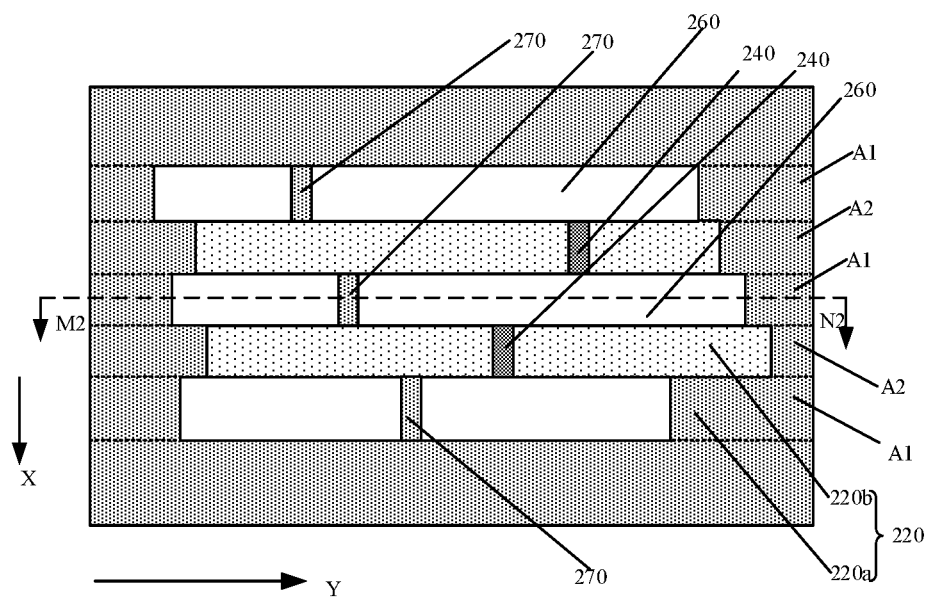
Figure 19:
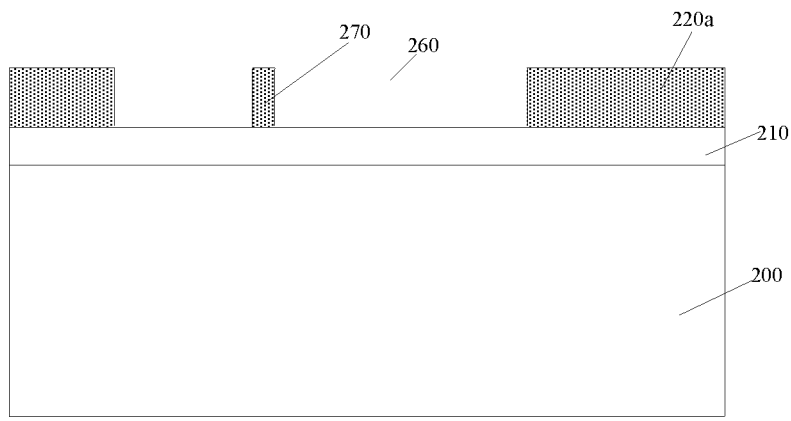

Further, returning to FIG. 24, the top mask layer may be removed (S407). FIGS. 18-19 illustrate schematic views of a semiconductor structure consistent with various embodiments of the present disclosure. Specifically, FIG. 18 shows the semiconductor structure from a view direction consistent with that in FIG. 16, FIG. 19 shows the semiconductor structure from a view direction consistent with that in FIG. 17, and FIG. 19 illustrates a schematic cross-sectional view of the semiconductor structure shown in FIG. 18 in an M2-N2 direction.

Referring to FIGS. 18-19, after partially removing the first mask layer 220 of the first regions A1 that is located on both sides of the top mask layer 250, the top mask layer 250 may be removed.

Figure 20:
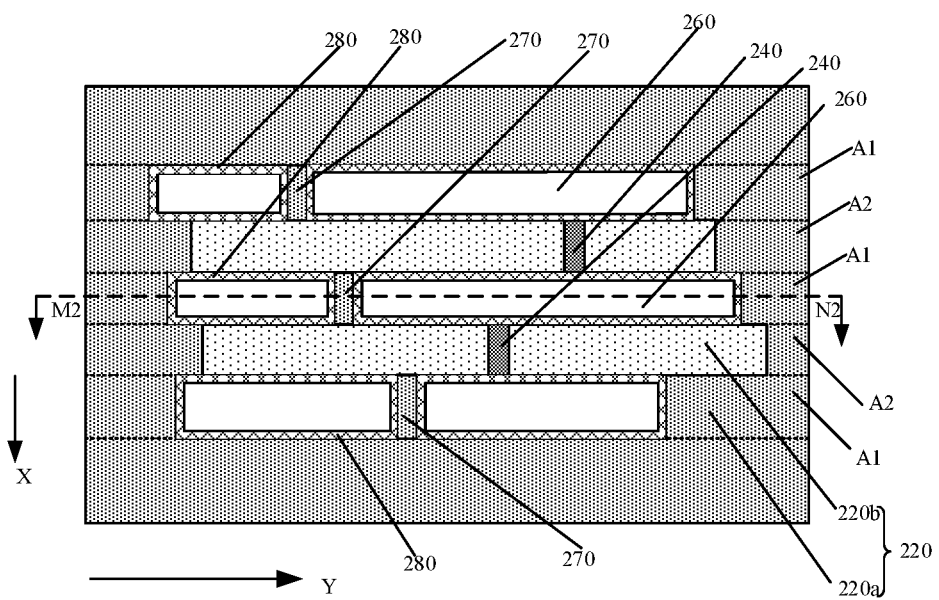
Figure 21:
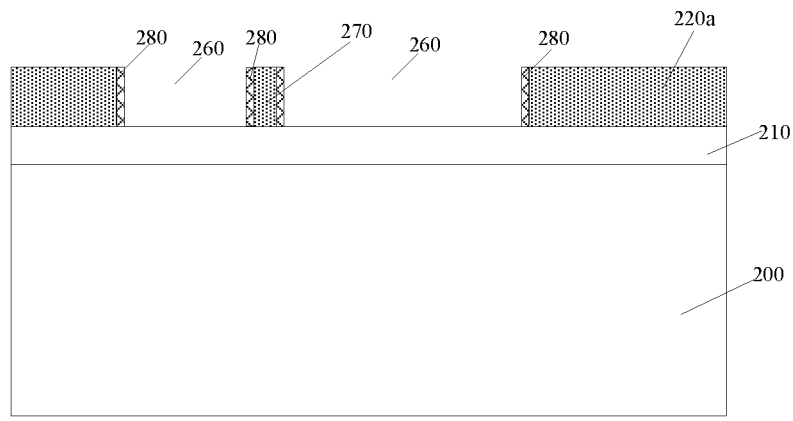

Further, returning to FIG. 24, a sidewall spacing layer may be formed on the sidewall surfaces of each first trench (S408). FIGS. 20-21 illustrate schematic views of a semiconductor structure consistent with various embodiments of the present disclosure. Specifically, FIG. 20 shows the semiconductor structure from a view direction consistent with that in FIG. 18, FIG. 21 shows the semiconductor structure from a view direction consistent with that in FIG. 19, and FIG. 21 illustrates a schematic cross-sectional view of the semiconductor structure shown in FIG. 20 in an M2-N2 direction.

Referring to FIGS. 20-21, a sidewall spacing layer 280 may be formed on the sidewall surfaces of each first trench 260. In one embodiment, the sidewall spacing layer 280 may be formed after removing the top mask layer 250.

In one embodiment, the sidewall spacing layer 280 may be made of a material including $SiO_2$, SiN, $TiO_2$, TiN, AlN, or $Al_2O_3$. The material of the sidewall spacing layer 280 may be different from the material of the first mask layer. For example, the material of the sidewall spacing layer 280 may be different from the material of the first mask layer not implanted with the doping ions. In one embodiment, the thickness of the sidewall spacing layer 280 may be in a range of approximately 10 nm to 25 nm.

In one embodiment, the process of forming the sidewall spacing layer 280 may include the following exemplary steps. A sidewall film layer may be formed on the sidewall and bottom surfaces of the first trench 260 and also on the top surface of the first mask layer 220. The sidewall film layer may then be etched back to expose the top surface of the first mask layer 220. The process adopted for forming the sidewall film layer may be a deposition process such as an atomic layer deposition (ALD) process. By using the ALD process to form the sidewall film layer, the formed sidewall film layer may demonstrate uniform thickness and have desired quality.

In one embodiment, the sidewall surfaces of the separation mask layer 270 that are perpendicular to the second direction Y may also be covered by the sidewall spacing layer 280. As such, the sidewall spacing layer 280 formed on the sidewall surfaces of the separation mask layer 270 may provide protection for the separation mask layer 270, and thus in the subsequent process of forming the plurality of second trenches, the separation mask layer 270 may not easily collapse.

Figure 22:
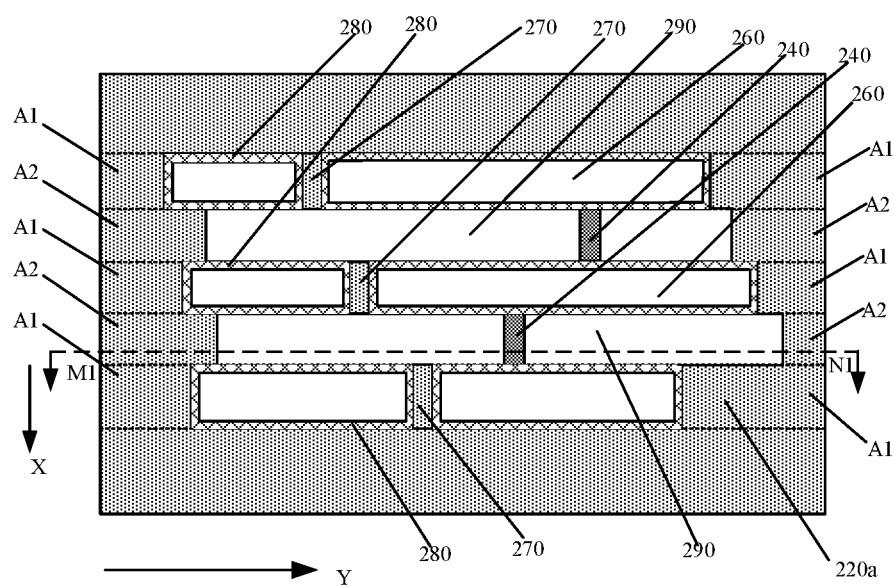
Figure 23:
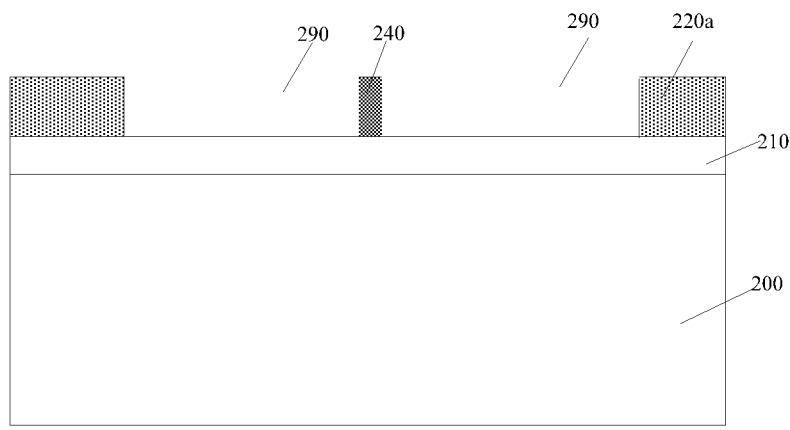

Further, returning to FIG. 24, the portion of the first mask layer formed in the trench region on both sides of the doped separation layer may be removed through etching to form a second trench in the first mask layer of the second region, the doped separation layer dividing the second trench into portions arranged in the second direction (S409). FIGS. 22-23 illustrate schematic views of a semiconductor structure consistent with various embodiments of the present disclosure. Specifically, FIG. 22 shows the semiconductor structure from a view direction consistent with that in FIG. 20, and FIG. 23 illustrates a schematic cross-sectional view of the semiconductor structure shown in FIG. 22 in an M1-N1 direction.

Referring to FIGS. 22-23, the portion of the first mask layer 220 formed in the trench region on both sides of the doped separation layer 240 may be removed through etching to form a second trench 290 in the first mask layer 220 of the second region A2. The doped separation layer 240 may divide the second trench 290 into portions arranged in the second direction Y.

In one embodiment, the second trench 290 may be formed after forming the sidewall spacing layer 280. The sidewall spacing layer 280 may be exposed in the second trench 290 and thus may serve as a portion of the sidewalls of the second trench 290. As such, the second trench 290 may be separated from an adjacent first trench 260 by the sidewall spacing layer 280.

In one embodiment, removing the portion of the first mask layer 220 formed in the trench region on both sides of the doped separation layer 240 may include a wet etching process.

During the process of removing the portion of the first mask layer 220 formed in the trench region on both sides of the doped separation layer 240, the etching rate of the portion of the first mask layer 220 not implanted with the doping ions may be greater than the etching rate of the portion of the first mask layer 220 implanted with the doping ions.

In one embodiment, during the process of removing the portion of the first mask layer 220 formed in the trench region on both sides of the doped separation layer 240, the etching rate of the undoped region 220b may be a first etching rate, the etching rate of the doped region 220a may be a second etching rate, and the ratio of the first etching rate to the second etching rate may be larger than or equal to approximately 100, e.g. 150.

In one embodiment, because the sidewall spacing layer 280 and the undoped region 220b are made of different materials, the process for removing the portion of the first mask layer 220 formed in the trench region on both sides of the doped separation layer 240 may be prevented from etching through the sidewall spacing layer 280 and causing penetration between the first trench and the adjacent second trench.

In one embodiment, because the doping ions implanted into the first mask layer 220 formed outside of the trench regions are the same as the doping ions implanted into the doped separation layer, the doped separation layer 240 may not be etched and removed during the process of removing the portion of the first mask layer 220 formed in the trench region on both sides of the doped separation layer 240.

In one embodiment, the extending direction (e.g., the length direction) of the second trench 290 may be parallel to the second direction Y. The width of the second trench 290 in the first direction X may be in a range of approximately 10 nm to 60 nm.

In one embodiment, prior to forming the first trench 260, the surfaces of the first mask layer 220 and the doped separation layer 240 may be flat, which may be conducive to the exposure process for patterning the photolithography material to define the position of the first trench 260.

In one embodiment, the fabrication method may also include etching the portion of the to-be-etched layer 200 at the bottom of the first trench 260 to form a first target trench in the to-be-etched layer 200; etching the portion of the to-be-etched layer 200 at the bottom of the second trench 290 to form a second target trench in the to-be-etched layer 200; forming a first conductive layer in the first target trench; and forming a second conductive layer in the second target trench.

In one embodiment, prior to etching the portion of the to-be-etched layer 200 at the bottom of the first trench 260 and the second trench 290, the fabrication method may also include etching the portion of the second adhesion layer, the bottom hard mask layer 210, and the first adhesion layer at the bottom of the first trench 260 to form a first hard mask trench in the bottom hard mask layer 210 at the bottom of the first trench 260; and etching the portion of the second adhesion layer, the bottom hard mask layer 210, and the first adhesion layer at the bottom of the second trench 290 to form a second hard mask trench in the bottom hard mask layer 210 at the bottom of the second trench 290.

In one embodiment, after etching the portion of the second adhesion layer, the bottom hard mask layer 210, and the first adhesion layer at the bottom of the first trench 260 and the portion of the second adhesion layer, the bottom hard mask layer 210, and the first adhesion layer at the bottom of the second trench 290, and prior to forming the first conductive layer and the second conductive layer, the first mask layer 220 and the second adhesion layer may be removed. After removing the first mask layer 220 and the second adhesion layer, the portion of the to-be-etch layer 200 at the bottom of the first hard mask trench may be etched to form a first target trench in the to-be-etched layer 200. The portion of the to-be-etch layer 200 at the bottom of the second hard mask trench may be etched to form a second target trench in the to-be-etched layer 200. After forming the first target trench and the second target trench, a conductive film layer may be formed in the first target trench and the second target trench and also on the bottom hard mask layer 210. The conductive film layer may be planarized until the top surface of the bottom hard mask layer 210 is exposed, such that a first conductive layer may be formed in the first target trench and a second conductive layer may be formed in the second target trench. Further, the bottom hard mask layer 210 and the first adhesion layer may be removed.

In one embodiment, the first conductive layer and the second conductive layer may be both made of a metal, e.g. copper, aluminum, etc.

Further, the present disclosure also provides a semiconductor device fabricated through the method described above. FIGS. 22-23 illustrate schematic views of an exemplary semiconductor device consistent with various embodiments of the present disclosure. Specifically, FIG. 22 illustrates a schematic top view of the semiconductor device and FIG. 23 illustrates a schematic cross-sectional view of the semiconductor device shown in FIG. 22 in the M1-N1 direction.

Referring to FIGS. 22-23, the semiconductor device may include a to-be-etched layer 200. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other, e.g., the first region A1 and the second region A2 may share an edge.

In one embodiment, the plurality of first regions A1 may be arranged along the first direction X, and the plurality of second regions may be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2.

The semiconductor device may include a first mask layer (not labeled) formed on the to-be-etched layer 200, a plurality of first trenches 260 formed in the first mask layer of the first regions A1, and a plurality of second trenches 290 formed in the first mask layer of the second regions A2. The first mask layer may be implanted with a plurality of doping ions, and thus the first mask layer may include an ion-doped region 220a. In one embodiment, the doping ions implanted into the ion-doped region 220a of the first mask layer may include boron ions and/or arsenic ions.

In some embodiments, the semiconductor device may also include a bottom hard mask layer 210 formed between the to-be-etched layer 200 and the first mask layer, a first adhesion layer formed between the bottom hard mask layer 210 and the to-be-etched layer 200, and a second adhesion layer formed between the bottom hard mask layer and the first mask layer.

In one embodiment, the first adhesion layer may be used to improve the adhesion between the bottom hard mask layer 210 and the to-be-etched layer 200, such that the bonding between the bottom hard mask layer 210 and the to-be-etched layer 200 may be stronger. The second adhesion layer may be used to improve the adhesion between the first mask layer and the bottom hard mask layer 210, such that the bonding between the first mask layer and the bottom hard mask layer 210 may be stronger.

When the bottom hard mask layer 210 is formed on the to-be-etched layer 200, the plurality of first trenches 260 and the plurality of second trenches 290 may expose the top surface of the bottom hard mask layer.

In one embodiment, each first trench 260 may be divided into portions arranged in a second direction Y by a separation mask layer 270, and each second trench 290 may be divided into portions arranged in the second direction Y by a doped separation layer 240. The second direction Y may be perpendicular to the first direction X.

In one embodiment, the semiconductor device may include a sidewall spacing layer 280 serving as the sidewalls of each first trench 260. The sidewall spacing layer 280 may also cover the sidewall surfaces of the separation mask layer 270. In one embodiment, each first trench 260 may be separated from an adjacent second trench 290 by a sidewall spacing layer 280.

In one embodiment, the size of the doped separation layer 240 in the first direction X may be in a range of approximately 10 nm to 60 nm, and the size of the doped separation layer 240 in the second direction Y may be in a range of approximately 10 nm to 40 nm.

In one embodiment, the width of the first trench 260 in the first direction X may be in a range of approximately 10 nm to 60 nm. Further, along the first direction X, the distance between two adjacent first trenches 260 may be in a range of approximately 10 nm to 60 nm.

In one embodiment, the size of the separation mask layer 270 in the first direction X may be in a range of approximately 10 nm to 60 nm, and the size of the separation mask layer 270 in the second direction Y may be in a range of approximately 10 nm to 40 nm.

In one embodiment, the thickness of the sidewall spacing layer 280 may be in a range of approximately 10 nm to 25 nm.

In one embodiment, the extending direction (e.g., the length direction) of the second trench 290 may be parallel to the second direction Y. The width of the second trench 290 in the first direction X may be in a range of approximately 10 nm to 60 nm.

Compared to existing semiconductor devices and fabrication methods, the disclosed semiconductor device and fabrication method may demonstrate the following exemplary advantages.

According to the disclosed semiconductor device and fabrication method, doping ions are implanted into the first mask layer formed outside of the trench regions, and a plurality of doped separation layers are formed in the first mask layer of the second regions. Therefore, the material of the first mask layer in the trench regions on both sides of each doped separation layer is different from the material of the doped separation layer, and the material of the first mask layer in the trench regions on both sides of each doped separation layer is also different from the material of the first mask layer formed outside of the trench regions. As such, by removing the portion of the first mask layer on both sides of the doped separation layer, a second trench is formed. According to the disclosed fabrication method, implanting the doping ions into the first mask layer outside of the trench regions and forming the doped separation layer are both completed prior to forming the plurality of first trenches, and the surface of the first mask layer is flat during the process of forming the doped separation layer. Therefore, the photolithography material used to define the position of the doped separation layer can be avoided from being formed in the first trench. The photolithography material used to define the position of the doped separation layer can be formed on the desired flat surface of the first mask layer, which is conducive to the exposure process for patterning the photolithography material. In addition, the photolithography material used when implanting the doping ions into the first mask layer outside of the trench regions can be avoided from being formed in the first trench, which is conducive to the exposure process for patterning the photolithography material. Further, prior to forming the first trench, the surfaces of the first mask layer and the doped separation layer are flat, thereby conducive to the exposure process for patterning the photolithography material to define the position of the first trench. As such, the disclosed fabrication method improves the performance of the formed semiconductor device.

Further, during the process of forming the first trench, a top mask layer is used as a mask, thereby during the process of etching the first mask layer to form a first trench in the first region, the portion of the first mask layer in the first region and located under the top mask layer is retained to form the separation mask layer. Therefore, each first trench is thus divided into portions arranged in the second direction by the separation mask layer. Because the separation mask layer is formed from a portion of the first mask layer, the bonding strength between the separation mask layer and the bottom material may be strong, and thus the separation mask layer may not easily collapse.

Further, prior to removing the portion of the first mask layer formed in the trench region on both sides of the doped separation layer, a sidewall spacing layer is formed on the sidewall surfaces of the first trench. As such, the sidewall spacing layer may also be formed on the two sidewall surfaces of the separation mask layer in the second direction. Therefore, the sidewall spacing layer formed on the sidewall surfaces of the separation mask layer is able to provide protection for the separation mask layer, such that during the process of forming the second trench, the separation mask layer may not easily collapse.

Further, when implanting the doping ions into the first mask layer formed outside of the trench regions, the doping ions are also implanted into the first mask layer of the first region. During the process of forming the doped separation layer, doping ions are also implanted into the portion of the first mask layer that is located in the first region adjacent to the doped separation layer along the first direction. As such, the definition of the ion-doped region and the undoped region in the first mask layer may not be affected. Because the doping ions are implanted into the portion of the first mask layer that is located in the first region adjacent to the doped separation layer along the first direction during the process of forming the doped separation layer, the process difficulty for forming the doped separation layer may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a to-be-etched layer, including a plurality of first regions and a plurality of second regions arranged alternately along a first direction, wherein for a first region of the plurality of first regions adjacent to a second region of the plurality of second regions, the first region and the second region adjoin each other, and each second region of the plurality of second regions includes a trench region;
   forming a first mask layer on the to-be-etched layer in both the plurality of first regions and the plurality of second regions;
   implanting doping ions into the first mask layer formed outside of the trench region;
   forming a doped separation layer in the first mask layer of each second region, wherein the doped separation layer divides the first mask layer formed in the trench region into portions arranged in a second direction perpendicular to the first direction;
   after implanting the doping ions into the first mask layer formed outside of the trench region and forming the doped separation layer in the first mask layer of the second region, forming a first trench in the first mask layer of each first region of the plurality of first regions; and
   after forming the first trench, removing the first mask layer formed in the trench region on both sides of the doped separation layer to form a second trench in the first mask layer of the second region, wherein the doped separation layer divides the second trench into portions arranged in the second direction.

2. The method according to claim 1, wherein:
   the doping ions include boron ions or arsenic ions.

3. The method according to claim 1, wherein:
   the first mask layer is made of a material including amorphous silicon.

4. The method according to claim 1, wherein:
   forming the doped separation layer after implanting the doping ions into the first mask layer formed outside of the trench region.

5. The method according to claim 1, wherein:
   implanting the doping ions into the first mask layer formed outside of the trench region after forming the doped separation layer.

6. The method according to claim 1, wherein:
   an ion implantation process is adopted to implant the doping ions into a portion of the first mask layer of the second region to form the doped separation layer.

7. The method according to claim 6, wherein:
   when forming the doped separation layer, the doping ions are also implanted into a side portion of the first mask layer that is located in the first region adjacent to the doped separation layer along the first direction.

8. The method according to claim 1, wherein:
   a size of the doped separation layer in the first direction is in a range of approximately 10 nm to 60 nm; and
   a size of the doped separation layer in the second direction is in a range of approximately 10 nm to 40 nm.

9. The method according to claim 1, wherein:
   removing the first mask layer formed in the trench region on both sides of the doped separation layer includes a wet etching process.

10. The method according to claim 1, wherein:
    when removing the first mask layer formed in the trench region on both sides of the doped separation layer by an etching process, an etching rate of a portion of the first mask layer not implanted with the doping ions is larger than an etching rate of a portion of the first mask layer implanted with the doping ions.

11. The method according to claim 1, wherein:
    when forming the first trench, a separation mask layer is formed from a portion of the first mask layer of the first region, wherein the separation mask layer divides the first trench into portions arranged in the second direction.

12. The method according to claim 11, wherein forming the first trench and the separation mask layer includes:
    forming a top mask layer on the first mask layer of the first region, wherein a projection pattern of the top mask layer on a surface of the first mask layer divides the first mask layer of the first region into portions arranged in the second direction, and a distance between the top mask layer and the doped separation layer is greater than zero;
    removing a portion of the first mask layer in the first region on both sides of the top mask layer using the top mask layer as an etch mask to form the first trench and the separation mask layer, wherein the separation mask layer is located under the top mask layer; and
    after removing the portion of the first mask layer in the first region on both sides of the top mask layer, removing the top mask layer.

13. The method according to claim 12, wherein:
    the top mask layer is made of a material including $SiO_2$, $SiN$, $TiO_2$, $TiN$, $AlN$, or $Al_2O_3$.

14. The method according to claim 12, wherein:
the top mask layer extends along the first direction to cover a portion of the first mask layer of the second region.

15. The method according to claim 11, wherein:
a size of the separation mask layer in the first direction is in a range of approximately 10 nm to 60 nm; and
a size of the separation mask layer in the second direction is in a range of approximately 10 nm to 40 nm.

16. The method according to claim 1, wherein:
the first trench of a first region adjoins adjacent trench regions;
prior to removing the portion of the first mask layer in the first region on both sides of the top mask layer, the method further includes forming a sidewall spacing layer on sidewall surfaces of the first trench; and
after forming the second trench, the sidewall spacing layer is exposed in the second trench and serves as a portion of sidewalls of the second trench.

17. The method according to claim 16, wherein:
the sidewall spacing layer is made of a material including $SiO_2$, SiN, $TiO_2$, TiN, AlN, or $Al_2O_3$.

18. The method according to claim 1, further including:
etching the to-be-etched layer exposed at a bottom of the first trench to form a first target trench in the to-be-etched layer;
etching the to-be-etched layer exposed at a bottom of the second trench to form a second target trench in the to-be-etched layer;
forming a first conductive layer in the first target trench; and
forming a second conductive layer in the second target trench.

* * * * *